US006764580B2

(12) United States Patent
Teng

(10) Patent No.: US 6,764,580 B2
(45) Date of Patent: Jul. 20, 2004

(54) APPLICATION OF MULTI-LAYER ANTISTATIC/ANTIREFLECTIVE COATING TO VIDEO DISPLAY SCREEN BY SPUTTERING

(75) Inventor: Yueh-Ming Teng, Taoyuan (TW)

(73) Assignee: Chungwa Picture Tubes, Ltd., Taoyuan (TW)

( * ) Notice: Subject to any disclaimer, the term of this patent is extended or adjusted under 35 U.S.C. 154(b) by 159 days.

(21) Appl. No.: 10/002,936

(22) Filed: Nov. 15, 2001

(65) Prior Publication Data

US 2003/0090195 A1 May 15, 2003

(51) Int. Cl.$^7$ ............................................. C23C 14/34
(52) U.S. Cl. ........................... 204/192.23; 204/192.12; 204/192.22
(58) Field of Search ....................... 204/192.12, 192.22, 204/192.23, 298.06, 298.07; 445/36

(56) References Cited

U.S. PATENT DOCUMENTS

| | | | |
|---|---|---|---|
| 2,522,531 A | 9/1950 | Mochel | 117/54 |
| 2,564,677 A | 8/1951 | Davis | 201/73 |
| 2,564,707 A | 8/1951 | Mochel | 117/54 |
| 2,564,709 A | 8/1951 | Mochel | 201/73 |
| 2,564,710 A | 8/1951 | Mochel | 201/73 |
| 2,612,611 A | 9/1952 | Szegho et al. | 250/80 |
| 2,680,205 A | 6/1954 | Burton | 313/92 |
| 2,734,142 A | 2/1956 | Barnes | 313/92 |
| 2,808,351 A | 10/1957 | Colbert et al. | 117/211 |
| 2,833,902 A | 5/1958 | Gaiser et al. | 201/73 |
| 2,852,415 A | 9/1958 | Colbert et al. | 117/211 |
| 2,919,212 A | 12/1959 | Gaiser | 117/215 |
| 2,977,412 A | 3/1961 | Rhodes et al. | 178/7.85 |
| 3,093,598 A | 6/1963 | McMillan et al. | 252/521 |
| 3,252,829 A | 5/1966 | Romstadt et al. | 117/211 |
| 3,689,312 A | 9/1972 | Long, III et al. | 117/94 |
| 3,738,732 A | 6/1973 | Ikenda | 117/33.3 |
| 4,263,335 A | 4/1981 | Wagner et al. | 427/29 |
| 4,393,095 A | 7/1983 | Greenberg | 427/87 |
| 4,463,114 A | 7/1984 | Balchunis et al. | 524/157 |
| 4,468,702 A | 8/1984 | Jandrell | 358/245 |
| 4,490,227 A | 12/1984 | Bitter | 204/192 |
| 4,563,612 A | 1/1986 | Deal et al. | 313/478 |
| 4,649,126 A | 3/1987 | Gaprindashvili et al. | 501/43 |
| 4,650,557 A | 3/1987 | Bitter | 204/192.12 |
| 4,695,045 A | 9/1987 | Chase et al. | 269/152 |
| 4,785,217 A | 11/1988 | Matsuda et al. | 313/479 |
| 4,857,361 A | 8/1989 | Bloss et al. | 427/109 |
| 4,884,006 A | 11/1989 | Prazak, III | 313/474 |
| 4,885,501 A | 12/1989 | Tong | 313/402 |
| 4,930,015 A | 5/1990 | Dougherty et al. | 358/246 |
| 4,945,282 A | 7/1990 | Kawamura et al. | 313/479 |
| 4,958,148 A | 9/1990 | Olson | 340/712 |
| 4,987,338 A | 1/1991 | Itom et al. | 313/478 |
| 5,011,443 A | 4/1991 | Park | 445/2 |
| 5,051,652 A | 9/1991 | Isomura et al. | 313/479 |
| 5,099,171 A | 3/1992 | Daiku et al. | 313/479 |
| 5,122,709 A | 6/1992 | Kawamura et al. | 313/479 |
| 5,150,004 A | 9/1992 | Tong et al. | 313/479 |
| 5,189,337 A | 2/1993 | Endo et al. | 313/479 |
| 5,200,667 A | 4/1993 | Iwasaki et al. | 313/478 |
| 5,204,177 A | 4/1993 | Sato et al. | 428/328 |
| 5,241,097 A | 8/1993 | Zupancic et al. | 556/460 |
| 5,254,904 A | 10/1993 | Van De Leest et al. | 313/479 |
| 5,279,851 A | 1/1994 | Minosou et al. | 427/126.2 |
| 5,291,097 A | 3/1994 | Kawamura et al. | 313/478 |
| 5,322,540 A | 6/1994 | Jacquet et al. | 65/60.2 |
| 5,370,981 A | 12/1994 | Krafft et al. | 430/529 |
| 5,372,924 A | 12/1994 | Quintens et al. | 430/527 |
| 5,376,308 A | 12/1994 | Hirai et al. | 252/518 |
| 5,378,404 A | 1/1995 | Han et al. | 252/500 |
| 5,382,383 A | 1/1995 | Hirai et al. | 252/501.1 |
| 5,387,433 A | 2/1995 | Balian et al. | 427/126.3 |
| 5,404,073 A | 4/1995 | Tong et al. | 313/479 |
| 5,412,279 A | 5/1995 | De Boer | 313/479 |
| 5,443,944 A | 8/1995 | Krafft et al. | 430/529 |
| 5,489,369 A | 2/1996 | Bjornard et al. | 204/298.25 |
| 5,492,762 A | 2/1996 | Hirai et al. | 428/447 |
| 6,325,901 B1 * | 12/2001 | Hirayama et al. | 204/192.22 |
| 6,478,932 B1 * | 11/2002 | Chu et al. | 204/192.28 |
| 2002/0041343 A1 * | 4/2002 | Ikui et al. | 348/819 |

FOREIGN PATENT DOCUMENTS

EP     0 585 819 A1    8/1993     A01J/28/36

* cited by examiner

*Primary Examiner*—Steven VerSteeg
(74) *Attorney, Agent, or Firm*—Emrich & Dithmar LLC

(57) ABSTRACT

A multi-layer antistatic/antireflective coating having high electrical conductivity ($10^3$ ohms) and low reflectivity (0.7%) is applied to the outer surface of a video display screen by sputtering. The multi-layer coating includes an inner antistatic layer deposited directly on the video display screen and comprised of ITO, $TiO_2$, etc., having a light refractive index in the range of 1.8–2.2 and a thickness in the range of 18–35 nm. The outer antireflective layer is comprised of $SiO_2$, MgO, etc., having a light refractive index in the range of 1.3–1.47 and a thickness in the range of 110–140 nm. The multi-layer coating is applied using a sputtering apparatus having a dual vacuum chamber, a diffusion pump connected to one of the chambers, and plural vacuum pumps connected to the diffusion pump and to the dual vacuum chamber with various gauges and valves for monitoring and controlling the sputtering operation.

14 Claims, 2 Drawing Sheets

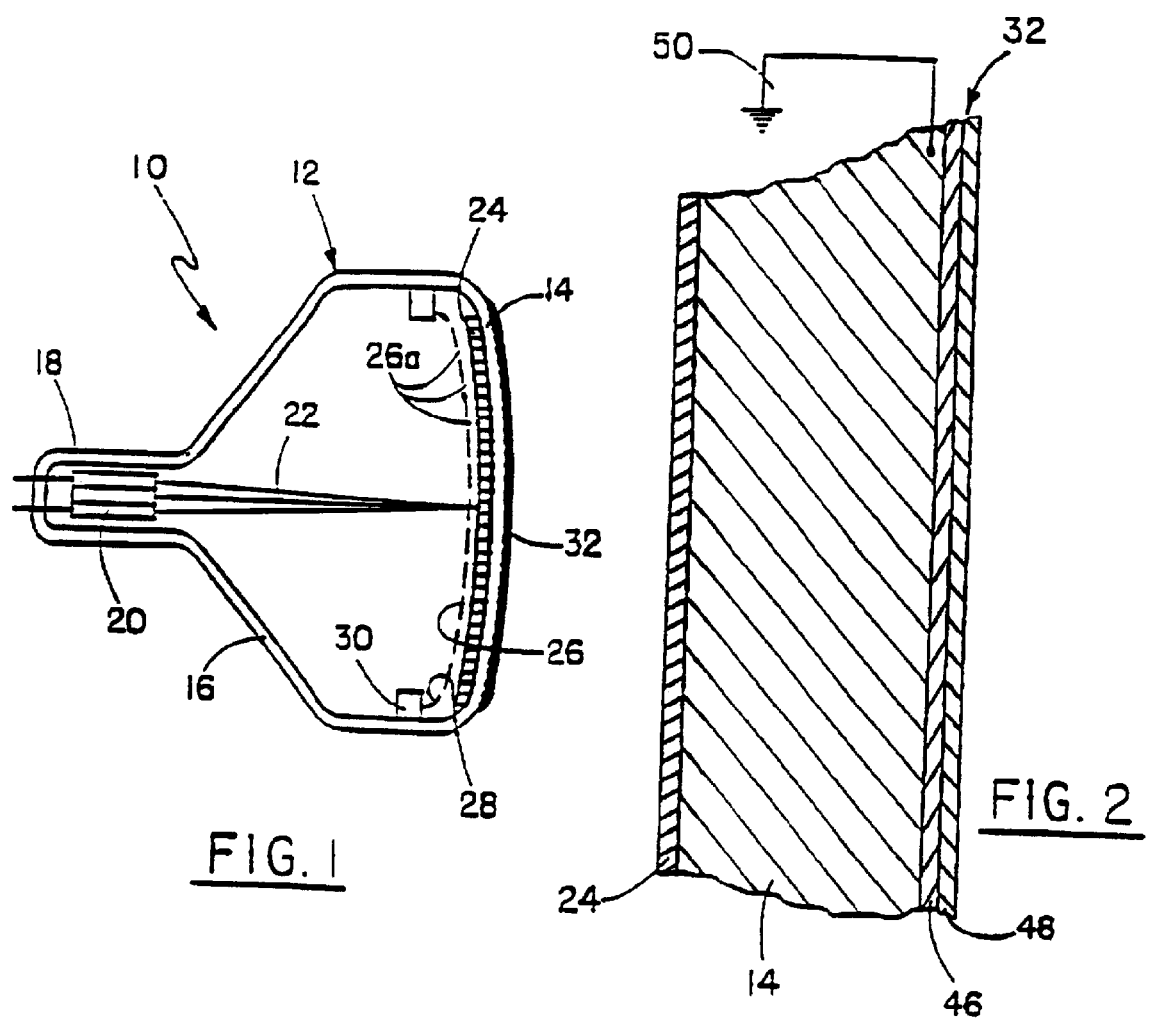

APPLICATION OF MULTI-LAYER ANTISTATIC/ANTIREFLECTIVE COATING TO VIDEO DISPLAY SCREEN BY SPUTTERING

FIELD OF THE INVENTION

This invention relates generally to surface coatings for video display screens and is particularly directed to a multi-layer antistatic/antireflective coating which is applied to the video display screen by sputtering.

BACKGROUND OF THE INVENTION

The outer surface of a display screen, or panel, of a video display device such as a cathode ray tube (CRT) is typically provided with a multi-layer coating which performs various functions. These functions include reducing light transmission through the glass display screen/outer coating combination for improved video image contrast. In addition, an inner layer of the surface coating is electrically conductive in order to shield viewers of the video display device from low frequency electromagnetic radiation and to dissipate electrostatic charge on the display panel to neutral ground. The coating also typically provides an antireflective capability to reduce light reflection from the display screen for ease in viewing a video image on the display screen.

Various approaches are employed in applying the multi-layer coating to the outer surface of a display screen. These techniques include spin and spray coating, sometimes referred to as the wet method, vacuum vapor deposition, and sputtering. Spin and spray coating methods have been widely used with materials containing Ag-Pd or Ag-Au colloid. While the coating thus formed possesses good electrical conductivity and relatively low light reflectance, it is of relatively low quality and involves high processing costs. These wet approaches also suffer from problems with reproducibility and control of the thickness of the coating and can be used with only a limited number of solvents. In addition, the spin and spray coating methods have problems when used with materials comprised of very fine (small) particles in providing uniform particle dispersion. These approaches also suffer from the possibility of environmental contamination.

The vacuum vapor deposition approach involves high temperature heat treatment and is thus energy intensive and more expensive than the wet coating approach. The sputtering approach has encountered difficulties in forming at high speed a stable $SiO_2$ layer having a low refractive index for use in the antireflective layer. One approach involving sputtering for applying a light absorptive antireflective layer to a CRT display screen is disclosed in U.S. Pat. No. 5,691,044. This approach applies an inner layer of TiN to the surface of a glass substrate. The TiN layer suffers from instability at the high temperatures used for applying the multi-layer coating to the glass substrate. To improve the heat resistance of the TiN layer, an oxide barrier layer of metal nitride (TiN) is formed on the inner TiN layer. This approach requires various reacting gases such as $N_2$ and $O_2$ in the sputtering process which increases the cost and complexity of video display screen manufacture.

The present invention avoids the limitations of the prior art by providing a multi-layer antistatic/antireflective coating applied by sputtering to the outer surface of a video display screen which allows for precise control over the thickness of the multi-layer coating as well as its light transmission and electrical resistivity characteristics.

OBJECTS AND SUMMARY OF THE INVENTION

Accordingly, it is an object of the present invention to deposit a multi-layer coating on a video display screen in an environmentally clean manner while maintaining the desired optical and electrical characteristics of the coating.

It is another object of the present invention to form a two-layer antistatic and antireflective coating on the surface of a video display screen by sputtering.

Yet another object of the present invention is to provide a low cost, highly reproducible composition for, and a method for applying to the surface of a video display screen, a multi-layer antistatic antireflective coating having a wide range of components.

A still further object of the present invention is to provide a sputter coating technique for depositing a multi-layer coating on the surface of a video display screen which eliminates the need for a reactive gas and allows for close control of coating conductivity and reflectance by precise control of individual layer thickness.

The present invention contemplates a process for forming an antistatic/antireflective coating on an outer surface of a video display screen comprising the steps of: sputter-depositing on the outer surface of the video display screen an inner metallic antistatic layer having a precisely controlled thickness within a range of 18–35 nm, wherein a light refractive index of the inner antistatic layer is also precisely controlled within a range of 1.8–2.2; and sputter-depositing on the inner antistatic layer an outer antireflective layer having a precisely controlled thickness within a range of 110–140 nm, wherein a light refractive index of the outer antireflective layer is also precisely controlled within a range of 1.3–1.47. This invention also contemplates a multi-layer coating for a video display panel having the aforementioned composition as well as apparatus for sputter depositing a multi-layer antistatic/antireflective coating on the surface of a video display screen.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is a longitudinal sectional view of a CRT incorporating an antireflective/antistatic coating in accordance with the principles of the present invention;

FIG. 2 is a partial sectional view of a flat display screen having an outer surface coating comprised of an inner antistatic layer and an outer antireflective layer in accordance with the present invention.

DETAILED DESCRIPTION OF THE PREFERRED EMBODIMENT

Figure 3:
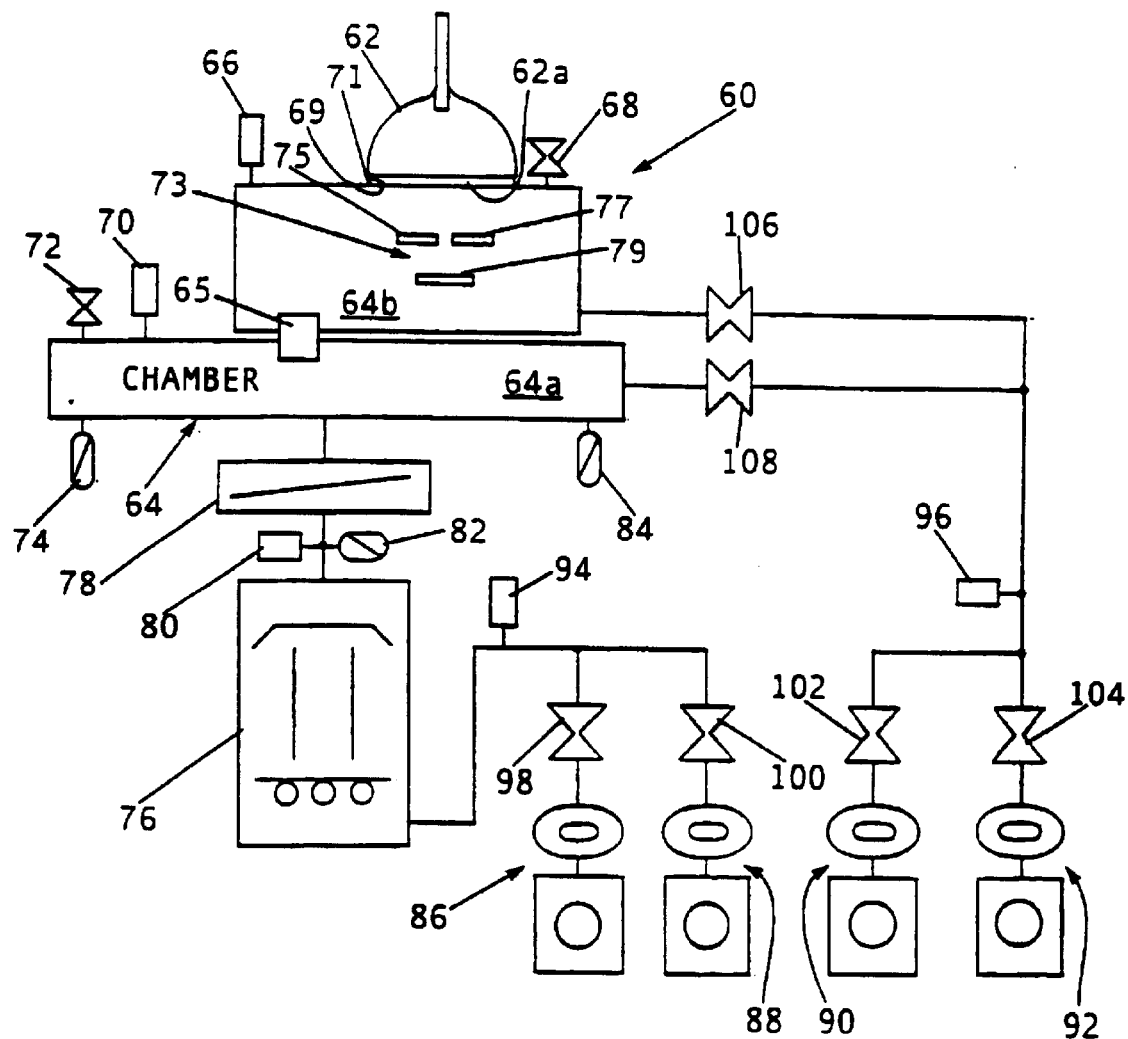
FIG. 3 is a simplified combined schematic and block diagram of apparatus for applying a multi-layer antireflective/antistatic coating on the outer surface of a video display screen by sputtering in accordance with one embodiment of the present invention.

Referring to FIG. 1, there is shown a longitudinal sectional view of a color CRT 10 incorporating an antistatic/antireflective coating 32 applied by sputtering in accordance with the present invention. In the following discussion the terms "display screen", "display panel" and "faceplate" are used interchangeably. In addition, the terms "layer" and "coating" are used synonymously. CRT 10 includes a sealed glass envelope 12 having a forward faceplate or display screen 14, an aft neck portion 18, and an intermediate funnel portion 16. Disposed on the inner surface of glass display screen 14 is a phosphor screen 24 which includes plural discrete phosphor deposits, or elements, which emit light when an electron beam is incident thereon to produce a video image on the display screen. Color CRT 10 includes three electron beams 22 directed onto and focused upon the CRT's glass display screen 14. Disposed in the neck portion 18 of the CRT's glass envelope 12 are plural electron guns 20 typically arranged in an inline array for directing the electron beams 22 onto the phosphor screen 24. The electron beams 22 are deflected vertically and horizontally in unison across the phosphor screen 24 by a magnetic deflection yoke which is not shown in the figure for simplicity. Disposed in a spaced manner from phosphor screen 24 is a shadow mask 26 having a plurality of spaced electron beam passing apertures 26a and a skirt portion 28 around the periphery thereof. The shadow mask skirt portion 28 is securely attached to a shadow mask mounting fixture 30 around the periphery of the shadow mask. The shadow mask mounting fixture 30 is attached to an inner surface of the CRT's glass envelope 12 and may include conventional attachment and positioning structures such as a mask attachment frame and a mounting spring which also are not shown in the figure for simplicity. The shadow mask mounting fixture 30 may be attached to the inner surface of the CRT's glass envelope 12 and the shadow mask 26 may be attached to the mounting fixture by conventional means such as weldments or a glass-based frit.

Referring to FIG. 2, there is shown a partial sectional view of a portion of the CRT's glass display screen 14 having the aforementioned phosphor layer 24 on the inner surface thereof and an outer antistatic/antireflective coating 32 on the outer surface thereof in accordance with the present invention. The glass display screen 14 of FIG. 2 is shown as being flat as the present invention is applicable to both curved display screens as shown in FIG. 1 as well as to flat display screens as shown in FIG. 2. In addition, while the present invention has been illustrated in the figures in terms of use on the outer surface of the display screen of a CRT, the present invention is not limited to use with this type of display device. For example, the antistatic/antireflective coating 32 of the present invention may be used equally as well on the outer surface of the display panel of virtually any type of self-emitting color display device, i.e., where the video image is produced by phosphor activated by energetic electrons incident thereon. Self-emitting color display devices other than CRTs include field emission displays, plasma discharge panels, vacuum fluorescent screens, and gas discharge screens. The phosphor layer 24 disposed on the inner surface of the glass display screen 14 may be in the form of a large number of discrete dots or stripes.

In accordance with the present invention, the antistatic/antireflective coating 32 includes an inner antistatic layer 46 and an outer antireflective layer 48. A conductor 50 may be attached to the inner antistatic layer 46 or to the outer surface portion of the display screen 14 for electrically coupling the display screen to neutral ground potential. In this manner, the build up of electrostatic charge on the display screen 14 is limited by discharging the electrostatic charge on the display screen to neutral ground via the electrically conductive inner antistatic layer 46.

Shown in FIG. 3 is a simplified combined schematic and block diagram of a sputter deposition apparatus 60 for applying an antistatic/antireflective coating to the outer surface of the glass display screen 62a of a CRT 62 in accordance with one aspect of the present invention. Sputter deposition apparatus 60 includes a dual chamber 64 comprised of a larger chamber 64a and a smaller chamber 64b which are connected together by means of a valve 65. A conventional sputtering system is disposed within the smaller vacuum chamber 64b for sputtering targets onto the outer surface of the display screen 62a of CRT 62. Each of the larger chamber 64a and the smaller chamber 64b has its own vacuum gauge and valve for controlling the respective pressures therein. Thus, the larger vacuum chamber 64a is provided with vacuum gauges 70, 74, and 84 for monitoring the pressure therein. A discharge valve 72 allows for air to enter the larger chamber 64a such as for performing maintenance on the larger chamber. Vacuum gauge 66 permits monitoring of the pressure in the smaller vacuum chamber 64b, while a discharge valve 68 allows for the entry of air into the smaller chamber for inserting or removing the display screen 62a of CRT 62. A diffusion pump 76 is connected to the combination of the larger chamber 64a and smaller chamber 64b via a gate 78. Vacuum gauges 80 and 82 are also connected between the diffusion pump 76 and the combination of the larger chamber 64a and smaller chamber 64b for monitoring the vacuum level within the diffusion pump. A pair of mechanical pumps 86 and 88 are connected to the diffusion pump 76 by means of respective valves 98 and 100. A vacuum gauge 94 is also connected between the mechanical pumps 86, 88 and the diffusion pump 76 for monitoring the pressure of the vacuum pumps. The combination of a pair of mechanical pumps 90 and 92 is coupled to the larger chamber 64a and the smaller chamber 64b by means of respective valves 108 and 106. In addition, mechanical pumps 90 and 92 are coupled to the valves 106 and 108 by means of valves 102 and 104, respectively, as well as by means of a vacuum gauge 96. Vacuum gauge 96 allows for monitoring the pressure of the vacuum pumps 90 and 92. The use of the larger chamber 64a in combination with the smaller chamber 64b allows for a reduction in the pumping time required for evacuating these chambers. The combination of diffusion pump 76 and mechanical pumps 86, 88, 90 and 92 are used for evacuating the larger and smaller chambers 64a and 64b.

Disposed within the smaller vacuum chamber 64b are first and second cathodes 75 and 77. The first cathode 75 is comprised of the material to be sputtered on the outer surface of the CRT's display screen 62a in the form of the first, inner antistatic layer. The second cathode 77 is comprised of the material for forming the second, outer antireflective layer deposited on the inner antistatic layer. The operation of the first and second cathodes 75, 77 is sequential, with the first cathode initially actuated for depositing the inner layer, followed by activation of the second cathode 77 for deposit of the outer layer of the multi-layer coating. The first and second cathodes 75, 77 are sequentially bombarded by positive ions using a positive ion source 79 as is conventional in sputtering devices. As a result of this ion bombardment, the first and second cathodes 75, 77 emit extremely small particles of the cathode material which are deposited uniformly on the outer surface of the CRT's display screen 62a.

The sputter deposition apparatus 60 operates in the following manner. Mechanical pumps 86 and 88 are turned on for pumping the diffusion pump 76 with valves 98 and 100 in the open position. Mechanical pumps 90 and 92 are turned on for pumping the larger vacuum chamber 64a with valves 102, 104 and 108 all in the open position. Valves 98, 100, 102 and 104 are always open. When the pressure of the diffusion pump 76 and the pressure in the larger vacuum chamber 64a reach the working pressure, gate 78 opens and valve 108 closes. The display screen 62a of CRT 62 is then loaded in an aperture 69 in the smaller vacuum chamber 64b and valve 106 opens for pumping the smaller vacuum chamber down to the working pressure by means of mechanical pumps 90 and 92. A seal 71 is disposed about aperture 69 in the smaller vacuum chamber 64b to maintain the smaller vacuum chamber under vacuum when the CRT 62 is inserted in the smaller vacuum chamber for coating its display screen 62a. When the pressure within the smaller vacuum chamber 64b reaches the working pressure, valve 65 disposed between the larger and smaller vacuum chambers 64a, 64b opens to equalize the pressure between the two chambers. The sputtering system within the smaller vacuum chamber 64b then deposits the sputtering targets onto the outer surface of the CRT's display screen 62a. This is accomplished by first bombarding the first cathode 75 with positive ions to produce small particles of the first cathode's composition which are deposited on the outer surface of the CRT's display screen 62a. This first layer is the inner antistatic layer. The second cathode 77 is then bombarded by positive ions to produce small particles of the second cathode's composition which are deposited in the form of a second outer layer on the inner antistatic layer. The second outer layer is the antireflective layer of the multi-layer coating on the CRT's display screen 62a. After coating the outer surface of the CRT's display screen 62a with the multi-layer antistatic/antireflective coating of the present invention, valve 65 closes and valve 68 opens for allowing air into the smaller vacuum chamber 64b while the larger chamber 64a is maintained under vacuum. The CRT 62 is then unloaded, or removed, from the smaller vacuum chamber 64b and another CRT is loaded in the smaller vacuum chamber. For coating the display screen of the next CRT, only the smaller chamber 64b needs to be evacuated by pumping. Once the smaller chamber 64b is evacuated, gate 65 is opened and the pressure in the larger and smaller chambers is equal. This arrangement and procedure reduces the time for reaching the working pressure in the two chambers. The above described sequence of steps is then repeated for the new CRT now loaded in the small vacuum chamber 64b. Periodically the larger and smaller vacuum chambers 64a, 64b must be cleaned. Closure of gate 78 allows the two chambers to be isolated from the diffusion pump 76 while the pump continues to run for cleaning the chambers. Once cleaned, the vacuum chambers are reconnected to the diffusion pump 76 for evacuation. This procedure reduces downtime for maintenance and allows for the processing of a larger number of CRTs.

The sputter deposition apparatus 60 of FIG. 3 permits the thickness of the inner antistatic layer 46 to be controlled with great precision. The thickness of the inner antistatic layer 46 may be controlled to within the range of 18–35 nm. The inner antistatic layer 46 is preferably formed of a doped metallic oxide, such as indium oxide doped with tin (ITO), tin oxide doped with fluorine ($SnO_2$:F), zinc oxide doped with indium (ZnO:In), zinc oxide doped with fluorine (ZnO:F), zinc oxide doped with aluminum (ZnO:Al), zinc oxide doped with tin (ZnO:Sn), or mixtures thereof. By precisely controlling the thickness of the inner antistatic layer 46, its light refractive index may be controlled to be within the range of 1.8–2.2. The inner antistatic layer 46 is preferably provided with a low conductivity such as on the order of $10^3$ ohms and a low reflectance on the order of 0.7%. The outer antireflective layer 48 preferably includes aluminum oxide ($Al_2O_3$) titanium oxide ($TiO_2$), zinc oxide (ZnO), zirconium oxide ($ZrO_2$), chrome oxide ($Cr_2O_3$), silica ($SiO_2$), or mixtures thereof. The thickness of the outer antireflective layer 48 may also be precisely controlled so as to be within a range of 110–140 nm. By thus controlling the thickness of the outer antireflective layer 48, its light refractive index may be precisely controlled to be within the range of 1.3–1. 47. The multi-layer antistatic/antireflective coating 32 preferably has high electrical conductivity (n $10^3$ ohms) and low light reflectivity (n 0.7%).

While particular embodiments of the present invention have been shown and described, it will be obvious to those skilled in the relevant arts that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A process for forming an antistatic/antireflective coating on an outer surface of a video display screen comprising the steps of:

sputter-depositing on the outer surface of the video display screen an inner metallic antistatic layer having a precisely controlled thickness within a range of 18–35 nm, wherein a light refractive index of said inner antistatic layer is also precisely controlled within a range of 1.8–2.2; and sputter-depositing on said inner antistatic layer an outer antireflective layer having a precisely controlled thickness within a range of 110–440 nm, wherein a light refractive index of said outer antireflective layer is also precisely controlled within a range of 1.3–1.47.

2. The process of claim 1 wherein said inner antistatic layer is comprised of a doped metallic oxide.

3. The process of claim 2 wherein said doped metallic oxide is ITO, $SnO_2$:F, ZnO:In, ZnO:F, ZnO:Al, ZuO:Sn, or mixtures thereof.

4. The process of claim 2 wherein said antistatic/antireflective coating has an electrical conductivity on the order of $10^3$ ohms.

5. The process of claim 1 wherein said outer antireflective layer is comprised of $Al_2O_3$, $TiO_2$, ZnO, $ZrO_2$, $Cr_2O_3$, MgO, $SiO_2$, or mixtures thereof.

6. The process of claim 5 wherein said antistatic/antireflective coating has a reflectivity on the order of 0.7%.

7. A method for sputter depositing an inner antistatic layer and an outer antireflective layer on the surface of a video display screen, said method comprising the steps of:

providing a first chamber including first and second cathodes respectively comprised of an antistatic material and an antireflective material, wherein said first chamber includes a sealed aperture;

providing a second chamber coupled to said first chamber by means of a valve;

evacuating said second chamber;

connecting a diffusion pump to said second chamber when the pressure in said second chamber and in said diffusion pump reaches a working pressure;

loading a video display screen in the scaled aperture of said first chamber and evacuating said first chamber to the working pressure;

opening the valve to equalize the pressure between said first and second chambers;

directing energetic positive ions on said first cathode for sputter depositing the antistatic material on the video display screen;

directing energetic positive ions on the second cathode for sputter depositing the antireflective material on the antistatic material;

releasing the working pressure from said first and second chambers; and removing the video display Screen from said first chamber.

8. The method of claim 7 further comprising the step of providing an antistatic material having a doped metallic oxide composition.

9. The method of claim 8 wherein said doped metallic oxide composition is ITO, $SnO_2$:F, ZnO:In, ZnO:F, ZnO:Al, ZnO:Sn, or mixtures thereof.

10. The method of claim 7 further composing the step of providing an antireflective material comprised of $Al_2O_3$, $TiO_2$, $ZnO$, $ZrO_2$, $Cr_2O_3$, $MgO$, $SiO_3$, or mixtures thereof.

11. The method of claim 7 wherein said antistatic layer has a thickness within a range of 18–35 nm and a light refractive index within a range of 1.8–2.2.

12. The method of claim 7 wherein said antireflective layer has a thickness within a range of 110–140 and a refractive index within a range of 1.3–1.47.

13. The method of claim 12 wherein the combination of said inner antistatic layer and said outer antireflective layer has an electrical conductivity on the order of $10^3$ ohms and a reflectivity on the order of 0.7%.

14. The method of claim 7 further comprising the step of isolating said first and second chambers from said diffusion pump while said diffusion pump continues in operation for performing maintenance on said first and second chambers.

* * * * *

UNITED STATES PATENT AND TRADEMARK OFFICE
CERTIFICATE OF CORRECTION

PATENT NO. : 6,764,580 B2
DATED : July 20, 2004
INVENTOR(S) : Yueh-Ming Teng

It is certified that error appears in the above-identified patent and that said Letters Patent is hereby corrected as shown below:

Title page,
Item [73], Assignee, change "Chungwa" to -- Chunghwa --

Column 6,
Line 48, change "scaled" to -- sealed --

Signed and Sealed this

Thirtieth Day of November, 2004

JON W. DUDAS
*Director of the United States Patent and Trademark Office*